United States Patent
Ramanathan et al.

(10) Patent No.: US 7,950,144 B2
(45) Date of Patent: May 31, 2011

(54) METHOD FOR CONTROLLING WARPAGE IN REDISTRIBUTED CHIP PACKAGING PANELS

(75) Inventors: Lakshmi N. Ramanathan, Chandler, AZ (US); George R. Leal, Cedar Park, TX (US); Douglas G. Mitchell, Tempe, AZ (US); Betty H. Yeung, Chandler, AZ (US)

(73) Assignee: Freescale Semiconductor, Inc., Austin, TX (US)

( * ) Notice: Subject to any disclaimer, the term of this patent is extended or adjusted under 35 U.S.C. 154(b) by 502 days.

(21) Appl. No.: 12/112,489

(22) Filed: Apr. 30, 2008

(65) Prior Publication Data

US 2009/0271980 A1 Nov. 5, 2009

(51) Int. Cl.
*H05K 3/30* (2006.01)
(52) U.S. Cl. ............... 29/832; 29/831; 29/834; 29/837; 29/846; 29/855
(58) Field of Classification Search ............... 29/832, 29/834, 837, 841, 846, 849, 855; 257/778, 257/706, 775, 701, 700; 438/108, 110, 112, 438/124, 127; 361/760, 761
See application file for complete search history.

(56) References Cited

U.S. PATENT DOCUMENTS

| | | | |
|---|---|---|---|
| 4,783,695 A | 11/1988 | Eichelberger et al. | |
| 5,315,486 A | 5/1994 | Fillion et al. | |
| 5,353,498 A | 10/1994 | Fillion et al. | |
| 5,841,193 A | 11/1998 | Eichelberger | |
| 6,159,767 A | 12/2000 | Eichelberger | |
| 6,459,075 B1 * | 10/2002 | McCarthy et al. | 219/725 |
| 6,486,005 B1 * | 11/2002 | Kim | 438/118 |
| 6,556,269 B1 * | 4/2003 | Takiar et al. | 349/150 |
| 6,838,776 B2 | 1/2005 | Leal et al. | |
| 6,921,975 B2 | 7/2005 | Leal et al. | |
| 6,989,586 B2 * | 1/2006 | Agraharam et al. | 257/678 |

* cited by examiner

*Primary Examiner* — Derris H Banks
*Assistant Examiner* — Tai Nguyen (57) ABSTRACT

A method is disclosed for controlling warpage in an integrated electronic panel assembly including a plurality of die embedded within an encapsulant. The method comprises determining a number of build-up layers required for the integrated panel assembly. Each build-up layer contributes an amount of concavity to the integrated electronic panel assembly. A level of global convex warpage on the integrated panel assembly is then predicted, wherein the global convex warpage is provided by the presence of an embedded ground plane (EGP) alone within the integrated panel assembly and in the absence of any build-up layers. The embedded ground plane includes openings therein for accepting at least one die within a corresponding opening and it contributes a fixed amount of global convex warpage. An amount of local convex warpage to be introduced into the integrated electronic panel assembly is then determined, which together with the fixed amount of global convex warpage provides a combined convex warpage to the integrated electronic panel assembly. Accordingly, the global and local convex warpage counteract the concavity to be introduced subsequently by a build-up layer processing and is sufficient to enable subsequent planar processing of a completed integrated electronic panel assembly.

19 Claims, 7 Drawing Sheets

METHOD FOR CONTROLLING WARPAGE IN REDISTRIBUTED CHIP PACKAGING PANELS

BACKGROUND

1. Field

This disclosure relates generally to redistributed chip panels, and more specifically, to a method for controlling warpage during a manufacture of redistributed chip packaging panels.

2. Related Art

Semiconductor and other types of electronic devices are often encapsulated wholly or partly in plastic resin to provide environmental protection and facilitate external connection to the devices. For convenience of explanation and not intended to be limiting, the present invention is described for semiconductor devices, but persons of skill in the art will understand that the present invention applies to any type of electronic device that is substantially in chip form. Accordingly, such other types of devices including the non-limiting examples given below, are intended to be included in the terms "device", "electronic device", "semiconductor device" and "integrated circuit" whether singular or plural, and the terms "device", "die" and "chip" are intended to be substantially equivalent. Non-limiting examples of suitable devices are semiconductor integrated circuits, individual semiconductor devices, piezoelectric devices, magnetostrictive devices, solid state filters, magnetic tunneling structures, integrated passive devices such as capacitors, resistors and inductors, and combinations and arrays of any and all of these types of devices and elements. Further, the present invention does not depend upon the types of die or chips being used nor the materials of which they are constructed provided that such materials withstand the encapsulation process.

In certain types of electronic device packaging where connections to multiple devices included in the package are made after encapsulation, there is a problem referred to as warping that can occur during encapsulation. Warping is of particular concern in electronic assemblies that are in the form of a comparatively flat or planar panel whose device electrical connections are exposed on a principal surface. It is often desired to form an integrated electronic assembly by interconnecting the various devices in the panel using planar processing technology. If the panel has warped during encapsulation, the process of adding interconnects becomes difficult, which can affect overall yield and cost. Thus, control or elimination of warping is important to achieving high manufacturing yields and low manufacturing costs in such encapsulated planar assemblies.

In addition, warpage of a redistributed chip panel (RCP) causes handling problems during the manufacture thereof. In particular, warpage of an RCP panel causes handling problems in build-up tools, during solder print/solder ball attach and during saw of finished packages from a completed panel. During the process of layer build-up and solder print the panel is supported by a ceramic carrier, however, the ceramic carrier is a reuseable component and thus needs to be removed prior to the saw operation. Ideally, a flat panel is needed for build-up, solder ball print, and saw of the unsupported completed panel into final packages. While an embedded ground plane (EGP) that is presently used in RCP panels produces a fixed warpage, the EGP cannot be manipulated. In other words, the use of an EGP or embedded framework that is flat with the surface of the die of an RCP panel produces a fixed amount of warpage that cannot be manipulated.

Accordingly, there is a need for an improved method and apparatus for overcoming the problems in the art as discussed above.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

The following detailed description is merely exemplary in nature and is not intended to limit the invention or the application and uses of the invention. Furthermore, there is no intention to be bound by any expressed or implied theory presented in the preceding technical field, background, brief summary or the following detailed description.

For simplicity and clarity of illustration, the drawing figures illustrate the general manner of construction, and descriptions and details of well-known features and techniques may be omitted to avoid unnecessarily obscuring the invention. Additionally, elements in the drawings figures are not necessarily drawn to scale. For example, the dimensions of some of the elements or regions in some of the figures may be exaggerated relative to other elements or regions of the same or other figures to help improve understanding of embodiments of the invention.

The terms "first," "second," "third," "fourth" and the like in the description and the claims, if any, may be used for distinguishing between similar elements and not necessarily for describing a particular sequential or chronological order. It is to be understood that the terms so used are interchangeable under appropriate circumstances such that the embodiments of the invention described herein are, for example, capable of operation or use in sequences other than those illustrated or otherwise described herein. Furthermore, the terms "comprise," "include," "have" and any variations thereof, are intended to cover non-exclusive inclusions, such that a process, method, article, or apparatus that comprises a list of elements is not necessarily limited to those elements, but may include other elements not expressly listed or inherent to such process, method, article, or apparatus. The terms "left," "right," "in," "out," "front," "back," "up," "down," "top," "bottom," "over," "under," "above," "below" and the like in the description and the claims, if any, are used for describing relative positions and not necessarily for describing permanent positions in space. It is to be understood that the embodiments of the invention described herein may be used, for example, in other orientations than those illustrated or otherwise described herein. The term "coupled," as used herein, is defined as directly or indirectly connected in an electrical or non-electrical manner. The term "bonding pad" singular or plural is intended to refer to any type of electrical connection place on a device and is not limited merely to those suitable for electrical connection by welding or soldering on a wire or other lead.

Figure 1:
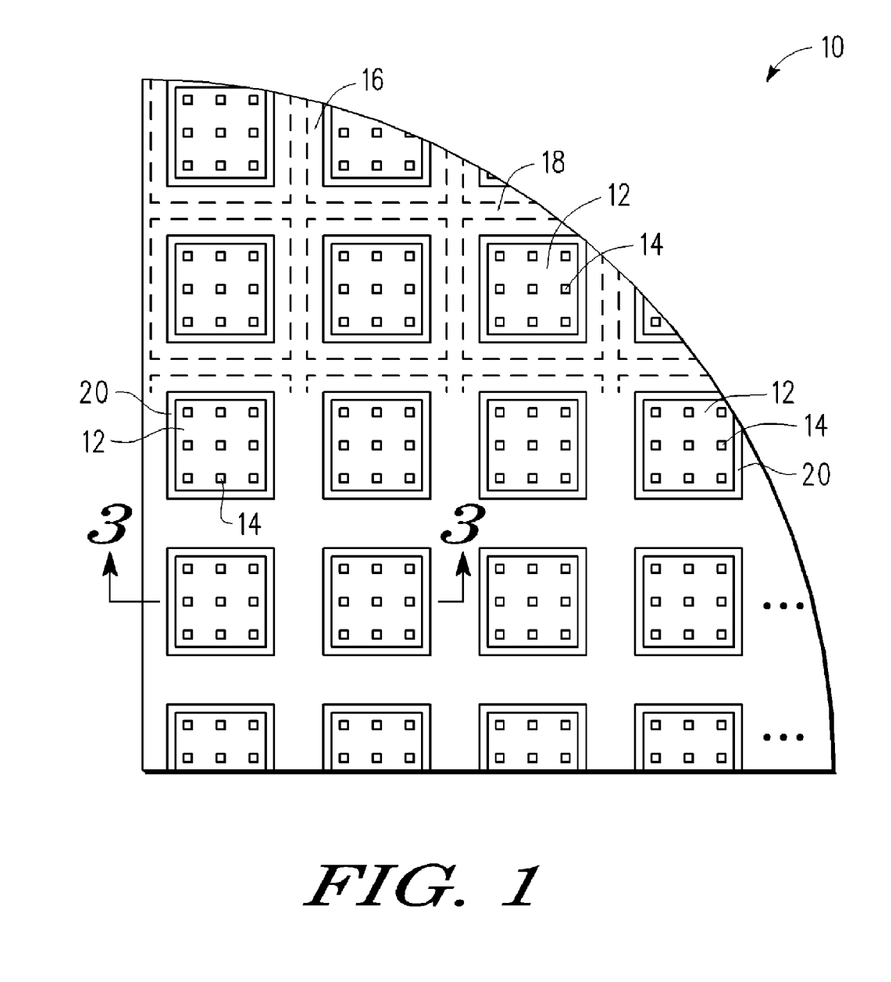
FIG. 1 is a top down view of a portion of a panel, absent any overlying build-up panelization layers, according to one embodiment of the present disclosure.

Referring now to the drawings, FIG. 1 is a top down view of a portion of a panel 10, absent any overlying build-up panelization layers, as will be discussed further herein. Panel 10 includes a number of semiconductor die 12 embedded within an encapsulant 20. At least one face of the semiconductor die 12 includes contact or bond pads 14, wherein the number of contact or bond pads per semiconductor die is a function of the requirements of the given die. Arranged in-between the multiple semiconductor die 12 is an embedded ground plane (EGP), indicated by reference numeral 16, wherein the embedded ground plane provides a global warpage control for panel 10. Accordingly, embedded ground plane 16 is also referred to herein as a global warpage control element. In one embodiment, embedded ground plane 16 provides global control of convex warpage for panel 10. In addition, panel 10 includes a local warpage control feature, generally indicated by phantom lines and reference numeral 18 in FIG. 1. In one embodiment, local warpage control feature 18 comprises metal posts that provide local control of convex warpage for panel 10, as will be discussed further herein. Each semiconductor die 12, and more particularly, a vertically oriented edge of each die is spaced from the embedded ground plane 16 by a region which is filled with encapsulant 20.

Figure 2:
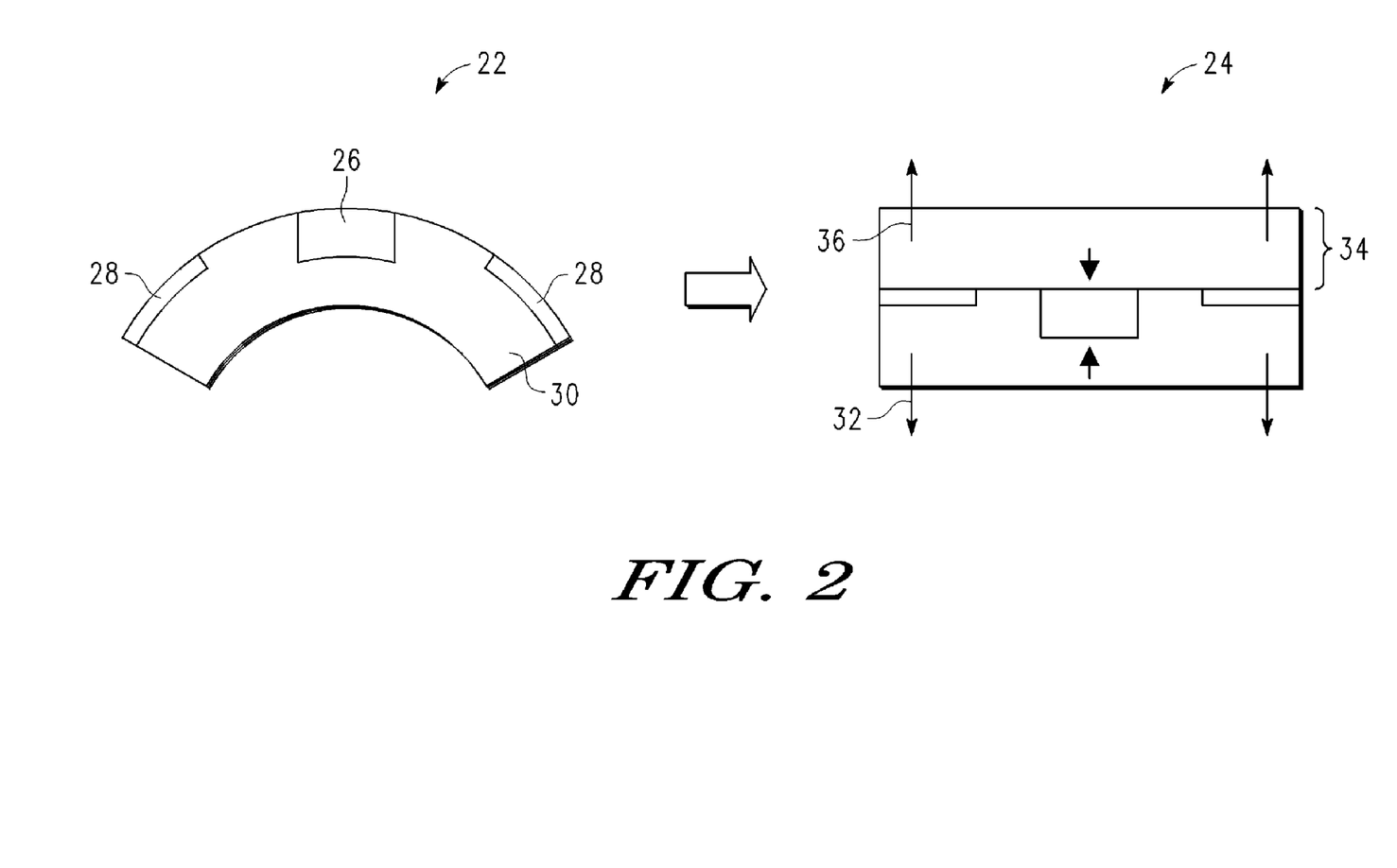
FIG. 2 is a diagrammatic view that illustrates a convex nature of panel warpage prior to build-up layer processing without the benefit of the teachings according to the embodiments of the present disclosure.

FIG. 2 illustrates a convex nature of panel warpage (shown greatly exaggerated) prior to build-up layer processing, as generally indicated by reference numeral 22, without the benefit of the teachings according to the embodiments of the present disclosure. In addition, FIG. 2 illustrates one example of flatness of the panel which may be achieved subsequent to build-up layer processing, as generally indicated by reference numeral 24. Prior to build-up layer processing, the panel includes semiconductor die 26, an embedded ground plane 28, and encapsulant 30. Due to the processing of the semiconductor die, embedded ground plane, and encapsulant in the formation of the panel, the panel exhibits convex warpage. In particular, the panel exhibits convex warpage in which the warpage proximate exterior portions of the panel is generally in a downward direction and warpage proximate the center of the panel is generally in an upward direction, as illustrated by arrows indicated by reference numeral 32. Upon the formation of build-up layers 34 overlying the convex warped panel layer, a certain amount of global warpage compensation is achieved, wherein the build-up panelization layer 34 contributes counteracting warpage in which the warpage proximate exterior portions of the build-up panelization layer 34 is generally in an upward direction and warpage proximate the center of the panel is generally in a downward direction, as illustrated by arrows indicated by reference numeral 36. As illustrated, while the panel with embedded ground plane and the overlying build-up layers together achieve a certain degree of overall warpage compensation, the embedded ground plane alone produces a fixed warpage that cannot be manipulated absent the teachings of the embodiments of the present disclosure.

Figure 3:
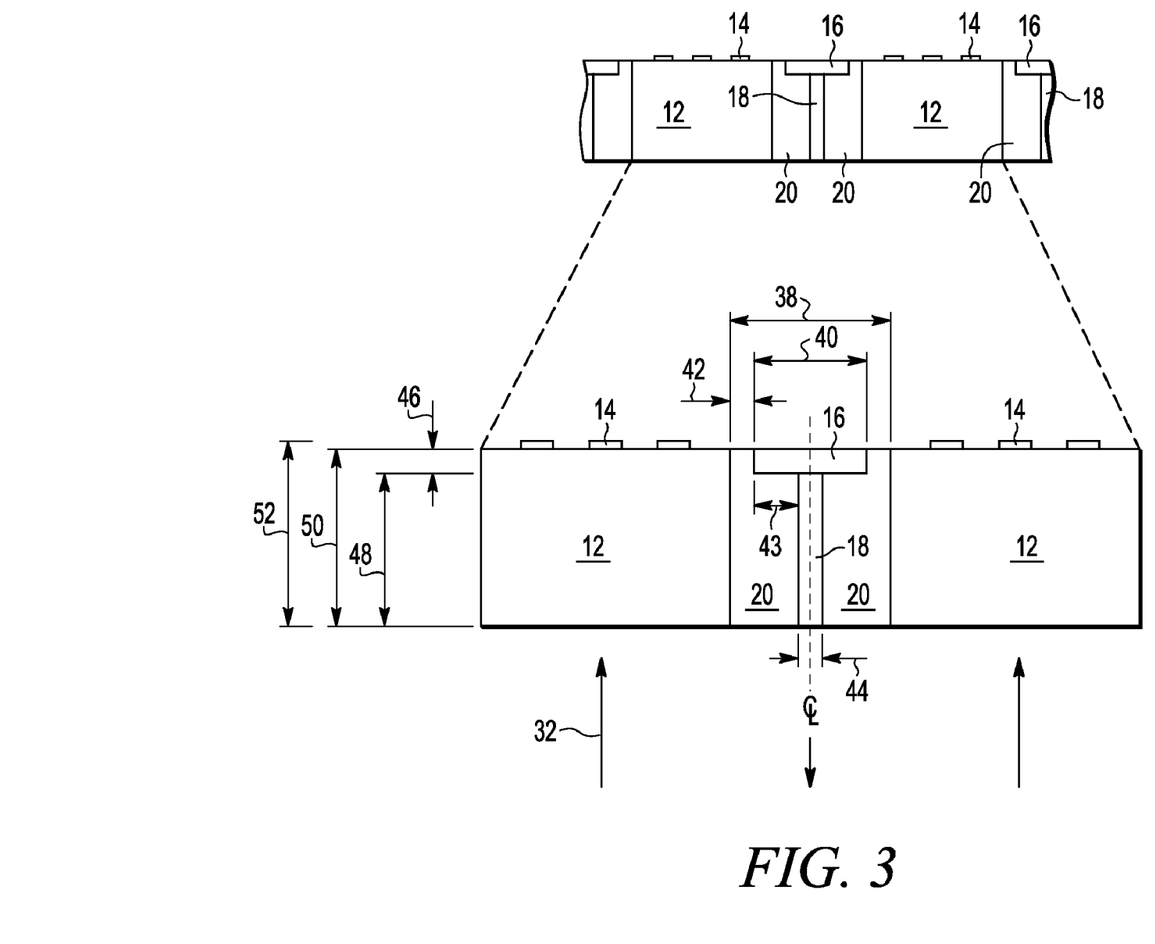
FIG. 3 is a partial cross-sectional view of a portion of the panel of FIG. 1 taken along line 3-3, according to one embodiment of the present disclosure.

FIG. 3 is a partial cross-sectional view of a portion of the panel 10 of FIG. 1 taken along line 3-3. In particular, the cross-sectional view illustrates two semiconductor die 12 in which a top surface of the semiconductor die include contact pads 14. The embedded ground plane or global warpage control element 16 is positioned in-between adjacent semiconductor die 12. In addition, local warpage control element 18 is positioned in-between adjacent semiconductor die 12 and in contact with the global warpage control element 16. Furthermore, encapsulant 20 occupies or otherwise substantially completely fills in those regions located in-between adjacent semiconductor die 12 and which are not occupied by either of the global warpage control element 16 or the local warpage control element 18. Keep in mind that the semiconductor die 12 are arranged in a grid like pattern for the panel 10 and that portions of the global and local warpage control elements 16 and 18, respectively, are located about side edges of each die 12, as illustrated in FIG. 1.

In the enlarged portion of FIG. 3, the spacing between adjacent ones of the semiconductor die 12 is generally indicated by reference numeral 38. Global warpage control element 16 is characterized by a width dimension 40, wherein the global warpage element 16 is generally equally spaced by an amount indicated by reference numeral 42 between adjacent semiconductor die 12 along the width 40 of the global warpage element. Spacing 42 thus represents the global warpage control element-to-semiconductor die spacing. In addition, the local warpage control element 18 is characterized by a width dimension 44. The width dimension 40 of the global warpage control element 16 and the width dimension 44 of the local warpage control element 18 are generally centered about a common center line $C_L$. In addition, width dimension 44 of local warpage control element 18 is less than width 40 of global warpage control element 16, wherein a portion of the global warpage control element overhangs from the local warpage control element by an amount indicated by reference numeral 43. This portion can be referred to as the "lip" of the global warpage control element 16.

With reference still to the enlarged portion of FIG. 3, the panel is further characterized by various height dimensions or thicknesses. For example, the height or thickness of the global warpage control element 16 is generally indicated by reference numeral 46. The height or thickness of local warpage control element 18 is generally indicated by reference numeral 48. In one embodiment, thickness 46 is on the order of five to twenty-five percent (5-25%) of thickness 48. The semiconductor die thickness is generally indicated by reference numeral 50. The thickness of the semiconductor die 12, contact pads 14, and any underlying encapsulant (not shown), which also substantially corresponds to a combined thickness of the global warpage control element 16 and local warpage control element 18, is generally indicated by reference numeral 52. In one embodiment, contact pads 14 are flush with the top surface of semiconductor die 12 and no encapsulant underlies semiconductor die 12, then the thicknesses 50 and 52 would be substantially equal. In addition, in one embodiment, the sum of thicknesses 46 and 48 substantially equals thickness 52, and wherein thickness 52 is greater than or equal to thickness 50.

According to the embodiments of the present disclosure, for a given width 40 of the global warpage control element 16, thickness 46, and spacing width 42, width 44 of the local warpage control element 18, thickness 48, and thus the dimension of lip 43 is selected for achieving a desired low-level warpage control. In one embodiment, the low-level warpage control comprises a warpage control amount in the range of −1.6 to −2.2 mm for a 300 mm diameter panel, wherein width 44 of the local warpage control element 18 is in the range of 0.5 to 2.5 mm. The negative number for the warpage amount represents a distance from a highest point to a lowest point on a same side of the convex shape. (Note that for a concave shape, the warpage amount would be expressed as a positive number from a lowest point to a highest point.) In contrast, warpage control using the global warpage control element 16 alone provides only high-level warpage control with a warpage control amount in the range of −5.8 to −5.9 mm for a 300 mm diameter panel. Accordingly, low-level warpage control and high-level warpage control comprise independent variables in connection with attaining a fine adjustment and a course adjustment, respectively, in warpage control.

In one embodiment, panel 10 comprises a 300 mm diameter panel having a thickness (indicated by reference numeral 52 in FIG. 3) on the order of 0.65 mm (approximately 26 mil). The global warpage control element 16 comprises an embedded ground plane having a thickness on the order of 0.125 mm (approximately 5 mil). In addition, the global warpage control element-to-die spacing 42 of panel 10 is on the order of 0.25 mm. Furthermore, the thickness 48 of the local warpage control element 18 is on the order of 0.525 mm (approximately 21 mils). For die having a dimension on the order of 5.8 mm×5.4 mm, and having a thickness on the order of 360 μm (approximately 14 mil), subsequently singulated packages obtained from a completed panel having build-up layers may include 9.0 mm×9.0 mm packages, resulting in approximately 716 singulated package units per panel.

Figure 4:
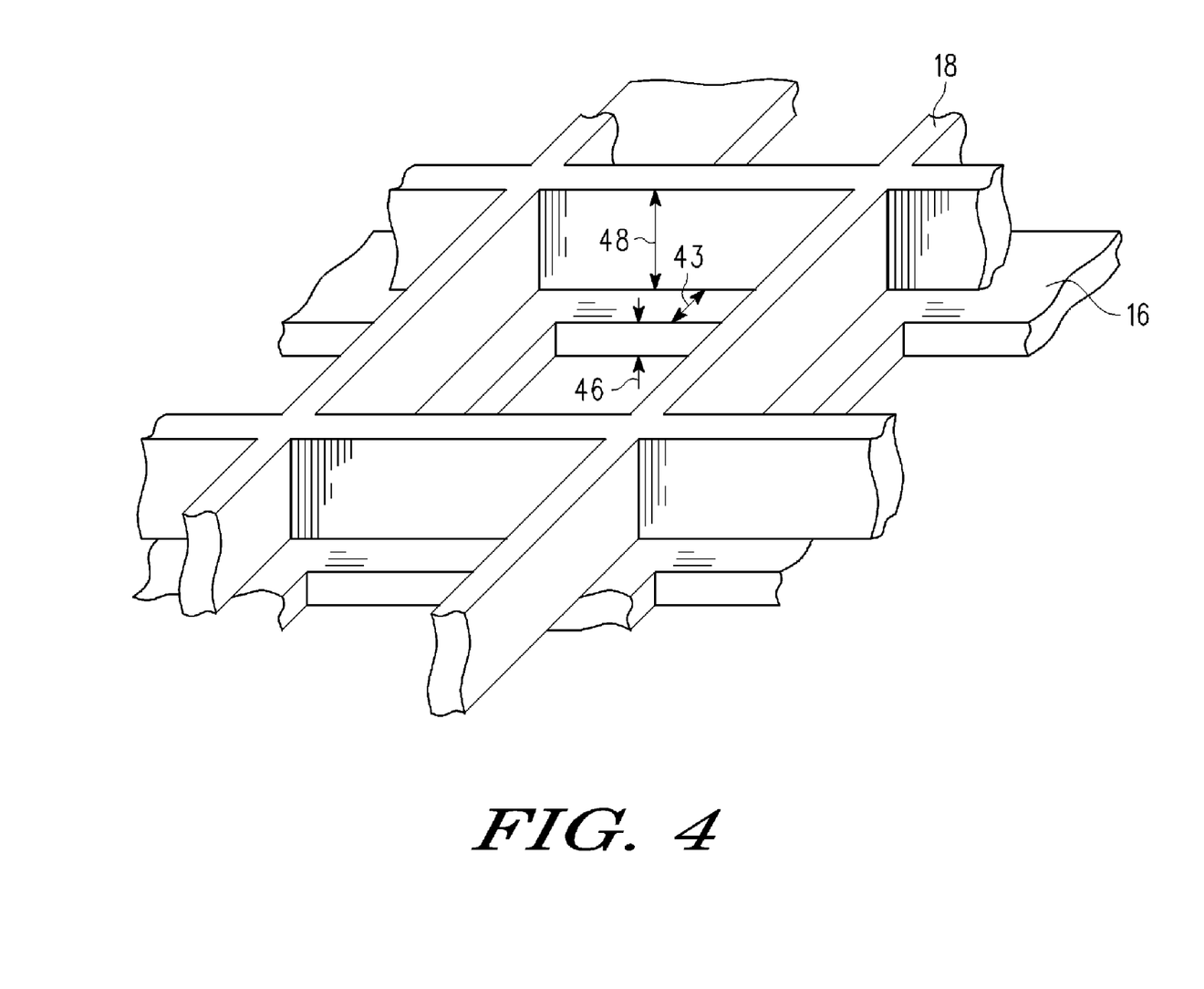
FIG. 4 is a partial plan view that illustrates a portion of the global warpage control element and the local warpage control element according to one embodiment of the present disclosure, in an orientation which is inverted from that illustrated in FIG. 1.

Turning now to FIG. 4, the figure illustrates a portion of the global warpage control element 16 and the local warpage control element 18 in an orientation which is inverted from that illustrated in FIG. 1. As previously noted, FIG. 1 illustrates a top down view in which the global warpage control element 16 overlies the local warpage control element 18, thus 18 is represented by the phantom lines in FIG. 1. However, for purposes of further illustration and clarification, FIG. 4 shows the local warpage control element 18 overlying the global warpage control element 16. As previously discussed, global warpage control element 16 comprises a thickness indicated by reference numeral 46. Local warpage control element 18 comprises a thickness indicated by reference numeral 48. In addition, the lip of the global warpage control element 16 is of a given width dimension, as indicated by reference numeral 43. As illustrated, the global warpage control element 16 comprises a solid embedded ground plane. In addition, the local warpage control element 18 comprises a continuous local warpage control element, wherein four side edges of a semiconductor die (not shown) located within the panel 10 are continuously surrounded by the local warpage control element 18. Embedded ground plane 16 and continuous local warpage control element 18 can comprise metal.

In one embodiment, the embedded ground plane and continuous local warpage control element comprise copper. In one embodiment, global warpage control element 16 is fabricated integral with local warpage control element 18. In another embodiment, global warpage control element 16 is fabricated separate from local warpage control element 18, and wherein upon fabrication of panel 10, the local warpage control element 18 is positioned and/or coupled with respect to global control element 16, for example, such that a centerline of corresponding widths of the same are aligned with one another, as illustrated in FIG. 3, further using suitable means such as an adhesive or the like.

Figure 5:
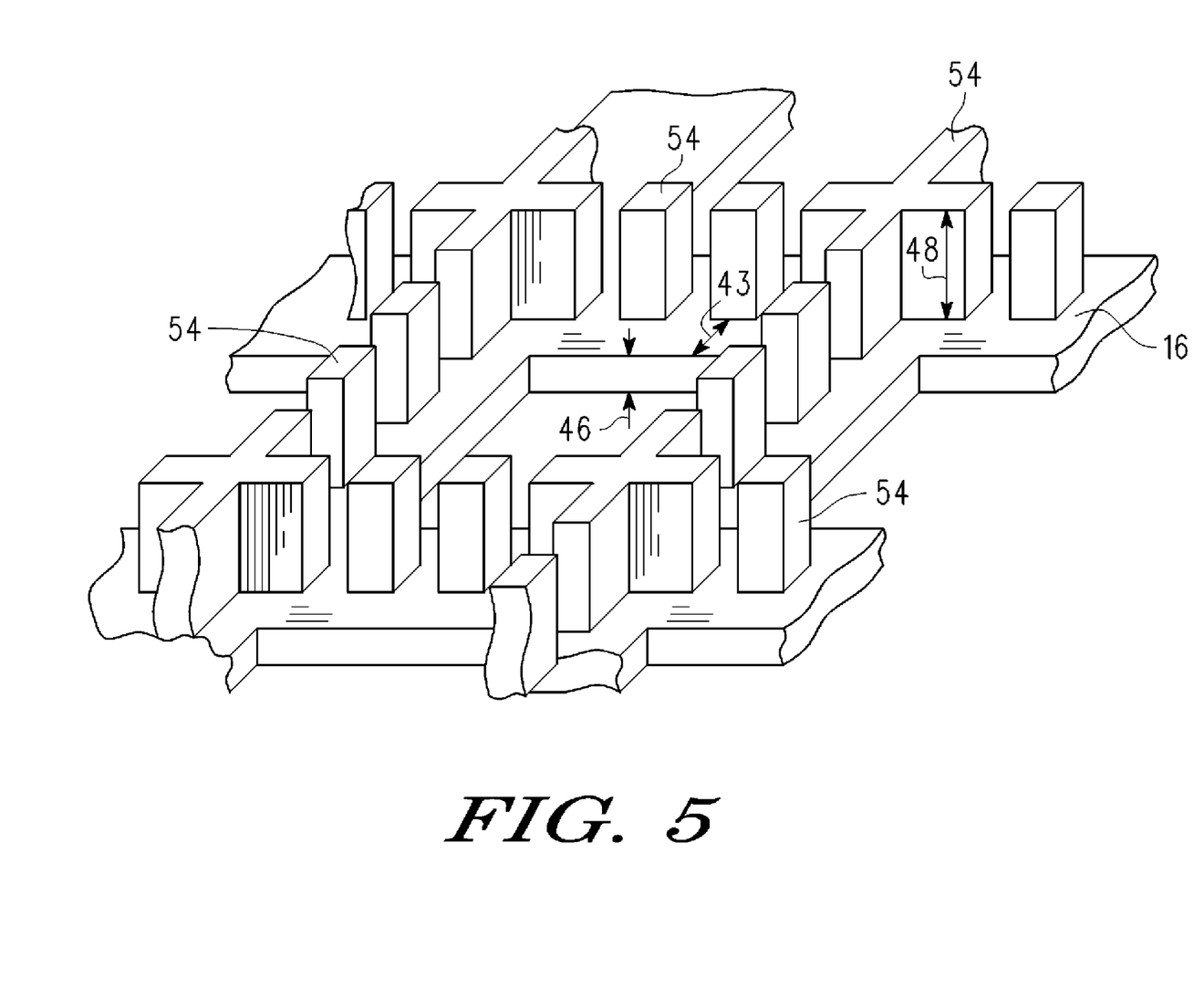
FIG. 5 is a partial plan view that illustrates a portion of the global warpage control element and the local warpage control element according to another embodiment of the present disclosure, in an orientation which is inverted from that illustrated in FIG. 1.

Turning now to FIG. 5, the figure illustrates a portion of the global warpage control element 16 and a local warpage control element 54 in an orientation similar to that as illustrated in FIG. 4, according to another embodiment. For purpose of further illustration and clarification, FIG. 5 shows the local warpage control element 54 overlying the global warpage control element 16. As previously discussed, global warpage control element 16 comprises a thickness indicated by reference numeral 46. Local warpage control element 54 comprises a thickness indicated by reference numeral 48. In addition, the lip of the global warpage control element 16 is of a given width dimension, as indicated by reference numeral 43. As illustrated, the global warpage control element 16 comprises a solid embedded ground plane. In addition, the local warpage control element 54 comprises a discontinuous local warpage control element, wherein four side edges of a semiconductor die located within the panel 10 are discontinuously surrounded by the local warpage control element 54. Embedded ground plane 16 and discontinuous local warpage control element 54 comprise metal. In one embodiment, the embedded ground plane and discontinuous local warpage control element comprise copper. In one embodiment, global warpage control element 16 is fabricated integral with the discontinuous portions of local warpage control element 54. In another embodiment, global warpage control element 16 is fabricated separate from the discontinuous portions of local warpage control element 54, and wherein upon fabrication of panel 10, the discontinuous portions of local warpage control element 54 are positioned and/or coupled with respect to global control element 16, for example, such that a centerline of corresponding widths of the same are aligned with one another, similarly as is illustrated in FIG. 3, further using suitable means such as an adhesive or the like.

A number of different implementations are possible for the continuous local warpage control element 18 of FIG. 4 and for the discontinuous local warpage control element 54 of FIG. 5. For example, for either of the continuous or discontinuous embodiments, the width of the local warpage control element along a first side edge of a die 12 may be a different width than that along a second side edge of the same die, wherein the second side edge could include an opposite side edge or an adjacent side edge. Furthermore, the width of the local warpage control element may comprise different widths along each of the four side edges of the semiconductor die 12, wherein the specific widths are selected according to the particular local warpage compensation requirements of a given panel. In addition, while the embodiment of the discontinuous local warpage control element 54 of FIG. 5 is illustrated in which the corners comprise solid corners, the same could include non-solid corners. In the later instance, the non-solid corners contain no metal but instead would be occupied with encapsulant subsequent to the corresponding encapsulation portion of the panel fabrication process.

In addition to the embodiments of varying the width of the local warpage control element, the pattern of the discontinuous local warpage control element 54 may also comprise different patterns of discontinuous elements along each of the four side edges of a semiconductor die, wherein the specific pattern of discontinuous elements is selected according to the particular local warpage compensation requirements of a given panel. For example, as illustrated in FIG. 5, the pattern of discontinuous elements of the local warpage control element 54 is substantially similar along each of four side edges of a semiconductor die, i.e., as illustrated, contains four elements per side edge per die. Each side edge pattern of the discontinuous elements of the local warpage control element 54 is shared with an adjacent neighboring die. In another embodiment, the pattern along a first edge may include a first number and pattern of discontinuous elements, and a second side edge may include a second number and pattern of discontinuous elements, wherein the first number and pattern differs from the second number and pattern. In addition, a pattern may include corners that comprise solid metal corners (as illustrated in FIG. 5), or corners that include non-solid corners. In the later instance, the non-solid corners contain no metal but instead would be occupied with encapsulant subsequent to the corresponding encapsulation portion of the panel fabrication process. While the die is not shown specifically illustrated in FIG. 5, it's placement is similar to that as shown in FIG. 1 with respect to the local warpage compensation element 18.

Furthermore, upon completion of the forming of build-up layers and further processing according to the requirements of a given integrated electronic package assembly, the panel is singulated. Singulation of the panel into individual packages includes, for example, sawing completely through a width of the local warpage compensation element (whether the continuous local warpage compensation element 18 or the discontinuous local warpage compensation element 54), wherein substantially all of local warpage compensation element (18, 54) is removed from individual packages. In another embodiment, the singulation of the panel into individual packages includes sawing through a portion of the local warpage compensation element (18, 54) along a width centerline thereof (whether the continuous local warpage compensation element 18 or the discontinuous local warpage compensation element 54), wherein at least a portion of the local warpage compensation element remains about a perimeter of the individual packages. In the later embodiment, such a remainder of the local warpage compensation element can further be configured to provide physical protection and/or electrical shielding for the individual packages.

Figure 6:
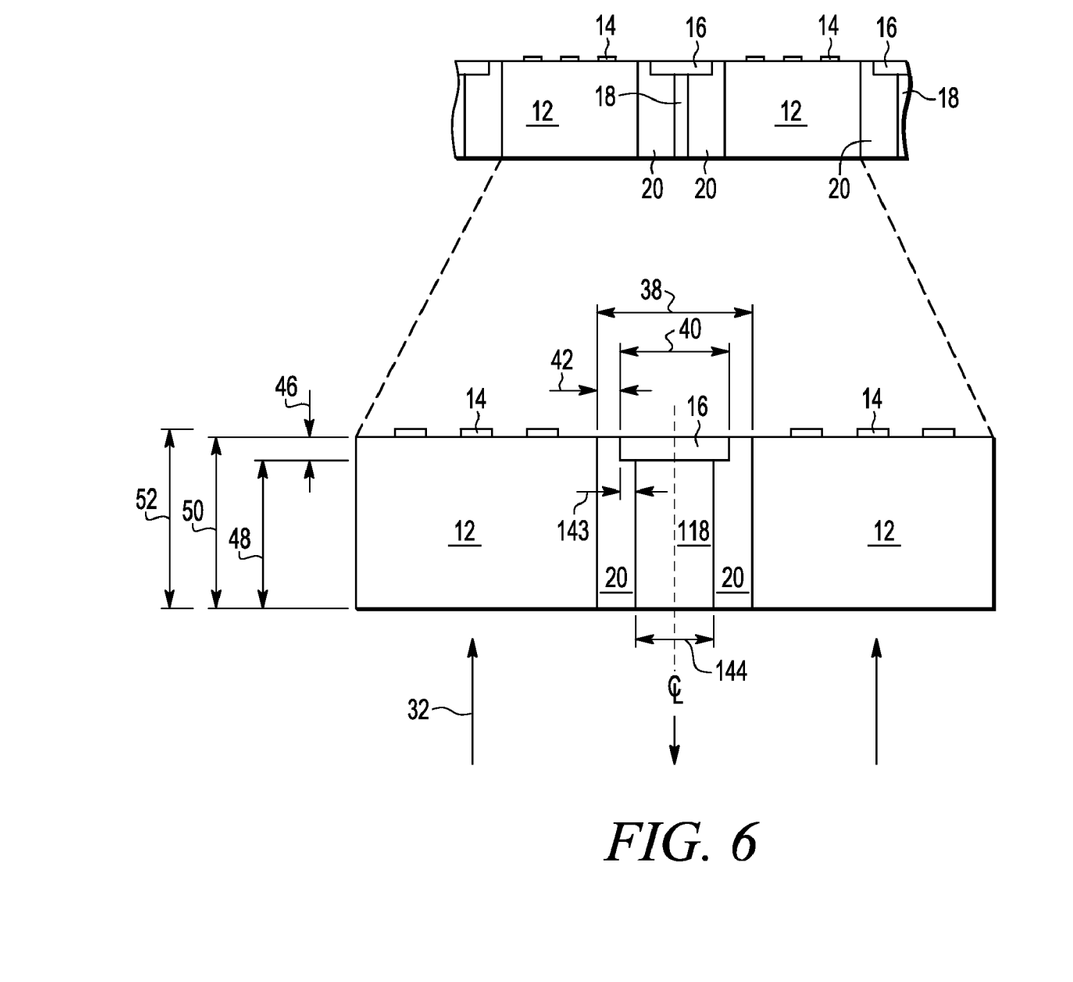
FIG. 6 is a partial cross-sectional view of a portion of the panel of FIG. 1 taken along line 3-3, similar to that illustrated in FIG. 3 and with differences according to another embodiment of the present disclosure.

FIG. 6 is a partial cross-sectional view of a portion of the panel 10 of FIG. 1 taken along line 3-3, similar to that illustrated in FIG. 3, according to another embodiment of the present disclosure, having the following differences. In the enlarged portion of FIG. 6, the spacing between adjacent ones of the semiconductor die 12 is generally indicated by reference numeral 38. Global warpage control element 16 is characterized by a width dimension 40, wherein the global warpage element 16 is generally equally spaced by an amount indicated by reference numeral 42 between adjacent semiconductor die 12 along the width 40 of the global warpage element. Spacing 42 thus represents the global warpage control element-to-semiconductor die spacing. In addition, the local warpage control feature 118 is characterized by a width dimension 144. The width dimension 40 of the global warpage control element 16 and the width dimension 144 of the local warpage control element 118 are generally centered about a common center line $C_L$. In addition, in one embodiment, width dimension 144 of local warpage control feature 118 is less than width 40 of global warpage control feature 16, wherein a portion of the global warpage control feature overhangs from the local warpage control feature by an amount indicated by reference numeral 143. This portion can be referred to as the "lip" of the global warpage control feature 16. In one embodiment, lip 143 comprises a width that is on the order of between 25-30% of the width 40 of global warpage compensation element 16.

Figure 7:
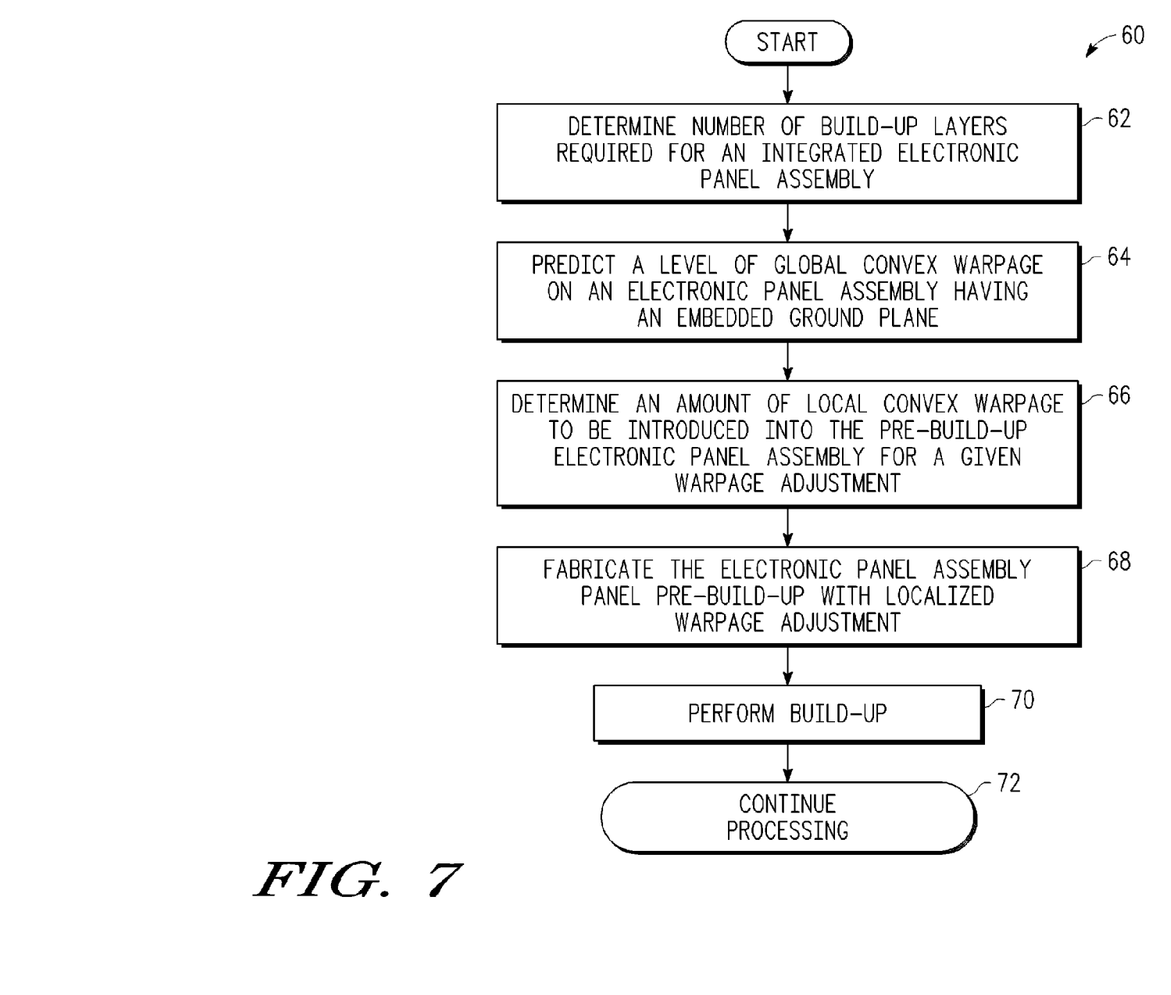
FIG. 7 is a flow diagram view of a method for controlling warpage in redistributed chip packaging panels according to one embodiment of the present disclosure.

Turning now to FIG. 7, FIG. 7 is a flow diagram view of a method 60 for controlling warpage in redistributed chip packaging panels according to one embodiment of the present disclosure. The method includes a number of steps, beginning at step 62. At step 62, the method includes determining a number of build-up layers required for a given integrated electronic panel assembly to be fabricated. In step 64, the method includes predicting a level of global convex warpage on the electronic panel assembly prior to build-up processing and having an embedded ground plane alone. In step 66, the method includes determining an amount of local convex warpage needing to be introduced into the pre-build-up electronic panel assembly for a given warpage adjustment. In other words, the amount of local convex warpage is determined, wherein the determined amount introduces a given warpage adjustment into the pre-build-up electronic panel assembly to compensate for the concave warpage that will be introduced into the build-up electronic panel assembly by the number of build-up layers needed, as determined in step 62. In step 68, the electronic panel assembly is fabricated pre-build-up layer processing, the panel including localized warpage adjustment as determined in step 66. Step 68 produces electronic panel assembly panels, pre-build-up layer processing, which have a given amount of global and local warpage compensation built-in as a result of the corresponding global and local warpage compensation elements. In step 70, the step of perfoming build-up layer processing upon the electronic panel assemblies output from step 68 is performed. Subsequent to the build-up layer processing, the resultant panel is substantially planar, i.e., suitable for further processing, as generally denoted by reference numeral 72. Further processing can include, for example, but is not limited to, solder print/solder ball attach, singulation into individual packages, or other form of planar processing, etc.

According to the embodiments of the present disclosure, the global warpage control element 16 and the local warpage control element 18 together advantageously provide for independently varying coarse and fine adjustments, respectively, to the warpage of a panel prior to build-up layer processing. In one embodiment, the initial warpage of the panel comprises a convex warpage, wherein subsequent build-up layer processing layers contribute to a concave warpage, and further wherein the cumulative effect of the panel convex warpage and build-up layer concave warpage provide a substantially planar resultant panel structure. By itself, the global warpage control element 16 guides the degree of convex panel warpage for given thicknesses of the semiconductor die, panel, and EGP of a given panel. The wider the die-to-EGP gap or the smaller the EGP lip, the more convex the warpage, corresponding to variables for a coarse warpage control adjustment. In addition, the local warpage control element 18 advantageously provides a low-level warpage control, corresponding to a variable for fine warpage control adjustment. Furthermore, for a die-to-EGP gap width 42 on the order of 0.2, 0.6, 1.0, and 1.2 mm, the overall controlled warpage is on the order of −1.8, −2.0, −3.3, and −5.9 mm, respectively.

According to one embodiment of the present disclosure, use of one or more Cu post in conjunction with an EGP lip advantageously allows for obtaining various degrees of manipulation of the undesirable warpage. In particular, by varying the width of the post and/or the EGP lip, a desired degree of manipulation of the undesirable warpage can be obtained. The embodiments of the present disclosure advantageously minimize or reduce undesirable panel warpage, wherein factors that affect warpage have been determined to include at least one or more of the following: relative areas of die/components, EGP, encapsulant, the thickness of die, the thickness of the EGP, number of build-up layers, and the relative amounts of metal in the various build-up layers.

According to another embodiment, a method for controlling warpage includes the selective use of metal posts which advantageously allows warpage to be controlled, further by using a post of an appropriate width. According to another embodiment, a method for controlling RCP panel warpage includes use of Cu posts, of varying widths to which an embedded ground plane (EGP) are attached. Varying the width of the Cu posts provides a change in the warpage of the package, and more particularly, in the redistributed chip package panel.

According to another embodiment, a method for manipulating the warpage of an RCP panel is configured as a function of the requirements of the RCP panel to be built. A goal of the method is to obtain a flat final RCP panel that can be processed via singulation, and more particularly, in the absence of a support panel carrier. As discussed, each build-up layer adds concavity to the panel. Thus, before build-up, the panel is configured to have a prescribed amount of convex warpage, so that the resultant effect after the addition of the concave build-up layers renders the panel substantially flat. The extent of convex warpage of the panel before build-up is selectively controlled based on the number of build-up layers that are needed for the given RCP panel.

In one embodiment, the method includes addition of Cu posts used in conjunction with an EGP 'lip', the widths of which can be varied, and can further be attached to the EGP at different heights from the front surface of the die. Stated in another way, in one embodiment, the method includes addition of Cu posts used in conjunction with a feature of an embedded ground plane (EGP), wherein the feature comprises a "lip" or shelf. In addition, the widths of the Cu posts can be varied. The Cu posts attach to the EGP, furthermore at different heights from the front surface of die within a plurality of die used for a given panel.

According to the various embodiments of the present disclosure, the method of controlling warpage for RCP panels includes one or more of: (i) using Cu posts of varying widths which allows for small-scale control in the warpage of a corresponding panel; (ii) using an EGP "lip" which affects large-scale warpage control of the panel; and (iii) integrating Cu posts and EGP "lip" into a single component of the EGP or maintained as individual component parts, depending upon the requirements of a given RCP panelization process. More particularly, the use of Cu posts of varying widths advantageously provides localized warpage control, corresponding to small-scale warpage control within a given panel. The use of the EGP lip advantageously provides global warpage control, corresponding to large-scale warpage control for a given panel.

According to one embodiment, finite element analysis, for example, implemented with software such as commercially available from ANSYS, Inc. of Canonsburg, Pa., can be used to predict warpage on 300 mm RCP panels of various configurations. The method for warpage control according to the embodiments of the present disclosure is advantageously configured to cause a level of convex warpage before build-up, since build-up layers cause concave warpage. The level of convex warpage counteracts and balances out the subsequent concave warpage. Ultimately, the method reduces overall warpage of the panel following build-up to enable successful sawing, bumping, etc.

The method according to the embodiments of the present disclosure advantageously enables control of warpage to varying degrees by means of the width of Cu posts and/or EGP lip for the specific package being built. The method according to the embodiments of the present disclosure comprises incorporating two types of warpage control features by means of attaching them or a method to manipulate warpage based on specific RCP package being built. The ability to control warpage aims to ensure the success of other subsequent processes that are to occur for the RCP including build-up, bumping, and singulation. The embodiments of the present disclosure result in higher overall yields at each process step, provides flexibility towards design and build-up processes not limited by warpage, and provides flexibility in other processes by enabling a warpage-controlled panel.

By now it should be appreciated that there has been provided a method for controlling warpage in an integrated electronic panel assembly including a plurality of die embedded within an encapsulant, the method comprising: determining a number of build-up layers required for the integrated electronic panel assembly, wherein each build-up layer contributes an amount of concavity to the integrated electronic panel assembly; predicting a level of global convex warpage on the integrated electronic panel assembly provided by the presence of an embedded ground plane (EGP) alone within the integrated electronic panel assembly and in the absence of any build-up layers, wherein the embedded ground plane includes openings therein for accepting at least one die within a corresponding opening, and wherein the embedded ground plane contributes a fixed amount of convex warpage globally to the integrated electronic panel assembly; and determining an amount of local convex warpage to be introduced into the integrated electronic panel assembly which together with the fixed amount of global convex warpage provides a combined convex warpage to the integrated electronic panel assembly, further for counteracting the concavity to be introduced subsequently by a build-up layer processing sufficient to enable subsequent planar processing of a completed integrated electronic panel assembly.

In one embodiment, the global convex warpage of the EGP by itself comprises a global warpage control element not subject to warpage manipulation. The global warpage control element contributes the fixed amount of global convex warpage to the integrated electronic panel assembly upon fabrication of the integrated electronic panel assembly. In addition, a local warpage control element contributes the amount of local convex warpage to the integrated electronic panel assembly upon fabrication thereof. In one embodiment, the local warpage control element comprises a metal post feature extending in between and along side edges of two adjacent die of the plurality of die, wherein a centerline of the metal post feature is disposed along a centerline of a corresponding portion of the EGP in between the two adjacent die. In another embodiment, the metal post feature has a width dimension less than a width dimension of the EGP, wherein the width dimension for the metal post feature and the width dimension for the EGP are measured in a direction perpendicular to the side edges of two adjacent die of the plurality of die. In a further embodiment, the integrated electronic panel assembly comprises a panel assembly having a principal dimension on the order of 200-300 mm in diameter and having a thickness on the order of 0.65 mm, wherein a die-to-die spacing between adjacent die is on the order of 2.0 mm, wherein the EGP includes a width dimension on the order of 1.5 mm and a thickness dimension on the order of 0.125 mm, and wherein the local warpage control element includes a width dimension on the order of 1.0 mm and a thickness dimension on the order of 0.525 mm.

According to another embodiment, the metal post feature comprises a plurality of discontinuous metal posts spaced from one another in a first direction along a first side edge of a die, spaced from one another in a second direction along a second side edge of the die, spaced from one another along a third direction along a third side edge of the die, and spaced from one another along a fourth direction along a fourth side of the die. In one embodiment, the spacing between metal posts in the first, second, third, and fourth directions is uniform. In another embodiment, the spacing between metal posts in the first, second, third, and fourth directions is non-uniform.

In yet another embodiment, the method further comprises: fabricating the integrated electronic panel assembly pre-build-up layer processing; and performing build-up layer processing, wherein the build-up layer processing includes forming the number of build-up layers that contribute a cumulative amount of concave warpage to the integrated electronic panel assembly, wherein together with the global and local convex warpage, the integrated electronic panel assembly with build-up layers is substantially planar for enabling subsequent planar processing. The subsequent planar processing includes at least one of singulation by sawing and die attach/solder bumping.

According to further embodiments, the step of predicting the level of global convex warpage includes performing a finite element analysis on the integrated electronic panel assembly. In addition, the global and local convex warpage levels collectively introduced before build-up layer processing counteract a concave warpage provided by the cumulative amount of concavity contributed by the build-up layers to the integrated electronic panel assembly after build-up layer processing. In another embodiment, the method further comprises introducing the amount of local convex warpage into the electronic panel assembly prior to build-up layer processing. The amount of local convex warpage provides a given local warpage adjustment.

In a still further embodiment, the method further comprises: fabricating the integrated electronic panel assembly pre-build-up with the predicted level of global convex warpage and the determined amount of local convex warpage; and continuing a processing of the integrated electronic panel assembly. The step of continuing a processing of the integrated electronic panel assembly can include performing build-up layer processing to form the number of build-up layers that contribute a cumulative amount of concave warpage to the integrated electronic panel assembly, wherein together with the global and local convex warpage, the integrated electronic panel assembly with build-up layers is substantially planar for enabling subsequent planar processing.

In another embodiment, a method for controlling warpage in an integrated electronic panel assembly including a plurality of die embedded within an encapsulant comprises: determining a number of build-up layers required for the integrated electronic panel assembly, wherein each build-up layer contributes an amount of concavity to the integrated electronic panel assembly; predicting a level of global convex warpage on the integrated electronic panel assembly provided by the presence of an embedded ground plane (EGP) alone within the integrated electronic panel assembly and in the absence of any build-up layers, wherein the embedded ground plane includes openings therein for accepting at least one die within a corresponding opening, and wherein the embedded ground plane contributes a fixed amount of convex warpage globally to the integrated electronic panel assembly, wherein the global convex warpage of the EGP by itself comprises a global warpage control element not subject to warpage manipulation, wherein the global warpage control element contributes the fixed amount of global convex warpage to the integrated electronic panel assembly upon fabrication of the integrated electronic panel assembly; determining an amount of local convex warpage to be introduced into the integrated electronic panel assembly which together with the fixed amount of global convex warpage provides a combined convex warpage to the integrated electronic panel assembly, further for counteracting the concavity to be introduced subsequently by a build-up layer processing sufficient to enable subsequent planar processing of a completed integrated electronic panel assembly, wherein a local warpage control element contributes the amount of local convex warpage to the integrated electronic panel assembly upon fabrication thereof; fabricating the integrated electronic panel assembly pre-build-up layer processing; performing build-up layer processing, wherein the build-up layer processing includes forming the number of build-up layers that contribute a cumulative amount of concave warpage to the integrated electronic panel assembly, wherein together with the global and local convex warpage, the integrated electronic panel assembly with build-up layers is substantially planar for enabling subsequent planar processing; and continuing a processing of the integrated electronic panel assembly.

According to yet another embodiment, a method for controlling warpage in an integrated electronic panel assembly including a plurality of die embedded within an encapsulant comprises: determining a number of build-up layers required for the integrated electronic panel assembly, wherein each build-up layer contributes an amount of concavity to the integrated electronic panel assembly; predicting a level of global convex warpage on the integrated electronic panel assembly provided by the presence of an embedded ground plane (EGP) alone within the integrated electronic panel assembly and in the absence of any build-up layers, wherein the embedded ground plane includes openings therein for accepting at least one die within a corresponding opening, and wherein the embedded ground plane contributes a fixed amount of convex warpage globally to the integrated electronic panel assembly, wherein the global warpage control element contributes the fixed amount of global convex warpage to the integrated electronic panel assembly upon fabrication of the integrated electronic panel assembly; determining an amount of local convex warpage to be introduced into the integrated electronic panel assembly which together with the fixed amount of global convex warpage provides a combined convex warpage to the integrated electronic panel assembly, further for counteracting the concavity to be introduced subsequently by a build-up layer processing sufficient to enable subsequent planar processing of a completed integrated electronic panel assembly, wherein a local warpage control element contributes the amount of local convex warpage to the integrated electronic panel assembly upon fabrication thereof, wherein the local warpage control element comprises a metal post feature extending in between and along side edges of two adjacent die of the plurality of die, wherein a centerline of the metal post feature is disposed along a centerline of a corresponding portion of the EGP in between the two adjacent die, further wherein the metal post feature has a width dimension less than a width dimension of the EGP, wherein the width dimension for the metal post feature and the width dimension for the EGP are measured in a direction perpendicular to the side edges of two adjacent die of the plurality of die; fabricating the integrated electronic panel assembly pre-build-up layer processing; and performing build-up layer processing, wherein the build-up layer processing includes forming the number of build-up layers that contribute a cumulative amount of concave warpage to the integrated electronic panel assembly, wherein together with the global and local convex warpage, the integrated electronic panel assembly with build-up layers is substantially planar for enabling subsequent planar processing, wherein the integrated electronic panel assembly comprises a panel assembly having a principal dimension on the order of 200-300 mm in diameter and having a thickness on the order of 0.65 mm, wherein a die-to-die spacing between adjacent die is on the order of 2.0 mm, wherein the EGP includes a width dimension on the order of 1.5 mm and a thickness dimension on the order of 0.125 mm, and wherein the local warpage control element includes a width dimension on the order of 1.0 mm and a thickness dimension on the order of 0.525 mm.

Although the invention is described herein with reference to specific embodiments, various modifications and changes can be made without departing from the scope of the present invention as set forth in the claims below. For example, the embodiments of the present disclosure can be applied to chips first and embedded chip/die technologies. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims. Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. A method for controlling warpage in an integrated electronic panel assembly including a plurality of die embedded within an encapsulant, the method comprising:
   determining a number of build-up layers required for the integrated electronic panel assembly, wherein each build-up layer contributes an amount of concavity to the integrated electronic panel assembly;
   predicting a level of global convex warpage on the integrated electronic panel assembly provided by the presence of an embedded ground plane (EGP) alone within the integrated electronic panel assembly and in the absence of any build-up layers, wherein
      the embedded ground plane includes openings therein for accepting at least one die within a corresponding opening,
      the global convex warpage is contributed by the embedded ground plane globally to the integrated electronic panel assembly, and
      the predicted level of global convex warpage is dependent upon one or more of: a gap between an edge of a die of the at least one die and an edge of the embedded ground plane opening containing the die, and a difference in width between a portion of the embedded ground plane and a local warpage control element coupled to that portion of the embedded ground plane; and
   determining an amount of local convex warpage to be introduced into the integrated electronic panel assembly which together with the fixed amount of global convex warpage provides a combined convex warpage to the integrated electronic panel assembly, further for counteracting a total concavity introduced subsequently by processing of the determined build-up layers sufficient to enable subsequent planar processing of a completed integrated electronic panel assembly, wherein
      one or more local warpage control elements contribute the amount of local convex warpage to the integrated electronic panel assembly upon fabrication thereof.

2. The method of claim 1, wherein the global convex warpage of the EGP by itself comprises a global warpage control element not subject to warpage manipulation.

3. The method of claim 2, wherein the global warpage control element contributes the fixed amount of global convex warpage to the integrated electronic panel assembly upon fabrication of the integrated electronic panel assembly.

4. The method of claim 1, wherein the local warpage control element comprises a metal post feature extending in between and along side edges of two adjacent die of the plurality of die, wherein a centerline of the metal post feature is disposed along a centerline of a corresponding portion of the EGP in between the two adjacent die.

5. The method of claim 4, further wherein the metal post feature has a width dimension less than a width dimension of the EGP, wherein the width dimension for the metal post feature and the width dimension for the EGP are measured in a direction perpendicular to the side edges of two adjacent die of the plurality of die.

6. The method of claim 5, wherein the integrated electronic panel assembly comprises a panel assembly having a principal dimension on the order of 200-300 mm in diameter and having a thickness on the order of 0.65 mm, wherein a die-to-die spacing between adjacent die is on the order of 2.0 mm, wherein the EGP includes a width dimension on the order of 1.5 mm and a thickness dimension on the order of 0.125 mm, and wherein the local warpage control element includes a width dimension on the order of 1.0 mm and a thickness dimension on the order of 0.525 mm.

7. The method of claim 4, further wherein the metal post feature comprises a plurality of discontinuous metal posts spaced from one another in a first direction along a first side edge of a die, spaced from one another in a second direction along a second side edge of the die, spaced from one another along a third direction along a third side edge of the die, and spaced from one another along a fourth direction along a fourth side of the die.

8. The method of claim 7, still further wherein the spacing between metal posts in the first, second, third, and fourth directions is uniform.

9. The method of claim 7, still further wherein the spacing between metal posts in the first, second, third, and fourth directions is non-uniform.

10. The method of claim 1, the method further comprising:
   fabricating the integrated electronic panel assembly pre-build-up layer processing; and
   performing build-up layer processing, wherein the build-up layer processing includes forming the number of build-up layers that contribute a cumulative amount of concave warpage to the integrated electronic panel assembly, wherein together with the global and local convex warpage, the integrated electronic panel assembly with build-up layers is substantially planar for enabling subsequent planar processing.

11. The method of claim 10, wherein the subsequent planar processing includes at least one of singulation by sawing and die attach/solder bumping.

12. The method of claim 1, wherein predicting the level of global convex warpage includes performing a finite element analysis on the integrated electronic panel assembly.

13. The method of claim 1, wherein the global and local convex warpage levels collectively introduced before build-up layer processing counteract a concave warpage provided by the cumulative amount of concavity contributed by the build-up layers to the integrated electronic panel assembly after build-up layer processing.

14. The method of claim 1, the method further comprising:
introducing the amount of local convex warpage into the electronic panel assembly prior to build-up layer processing.

15. The method of claim 14, wherein the amount of local convex warpage provides a given local warpage adjustment.

16. The method of claim 1, the method further comprising:
fabricating the integrated electronic panel assembly pre-build-up with the predicted level of global convex warpage and the determined amount of local convex warpage; and
continuing a processing of the integrated electronic panel assembly.

17. The method of claim 16, wherein continuing a processing of the integrated electronic panel assembly includes performing build-up layer processing to form the number of build-up layers that contribute a cumulative amount of concave warpage to the integrated electronic panel assembly, wherein together with the global and local convex warpage, the integrated electronic panel assembly with build-up layers is substantially planar for enabling subsequent planar processing.

18. A method for controlling warpage in an integrated electronic panel assembly including a plurality of die embedded within an encapsulant, the method comprising:
determining a number of build-up layers required for the integrated electronic panel assembly, wherein each build-up layer contributes an amount of concavity to the integrated electronic panel assembly;
predicting a level of global convex warpage on the integrated electronic panel assembly provided by the presence of an embedded ground plane (EGP) alone within the integrated electronic panel assembly and in the absence of any build-up layers, wherein
the embedded ground plane includes openings therein for accepting at least one die within a corresponding opening,
the global convex warpage is contributed by the embedded ground plane globally to the integrated electronic panel assembly,
the global convex warpage of the EGP by itself comprises a global warpage control element not subject to warpage manipulation,
the global warpage control element contributes global convex warpage to the integrated electronic panel assembly upon fabrication of the integrated electronic panel assembly, and
the predicted level of global convex warpage is dependent upon one or more of: a gap between an edge of a die of the at least one die and an edge of the embedded ground plane opening containing the die, and a difference in width between a portion of the embedded ground plane and a local warpage control element coupled to that portion of the embedded ground plane;
determining an amount of local convex warpage to be introduced into the integrated electronic panel assembly which together with the fixed amount of global convex warpage provides a combined convex warpage to the integrated electronic panel assembly, further for counteracting a total concavity introduced subsequently by processing of the determined build-up layers sufficient to enable subsequent planar processing of a completed integrated electronic panel assembly, wherein a local warpage control element contributes the amount of local convex warpage to the integrated electronic panel assembly upon fabrication thereof;
fabricating the integrated electronic panel assembly pre-build-up layer processing;
performing build-up layer processing, wherein the build-up layer processing includes forming the number of build-up layers that contribute a cumulative amount of concave warpage to the integrated electronic panel assembly, wherein together with the global and local convex warpage, the integrated electronic panel assembly with build-up layers is substantially planar for enabling subsequent planar processing; and
continuing a processing of the integrated electronic panel assembly.

19. A method for controlling warpage in an integrated electronic panel assembly including a plurality of die embedded within an encapsulant, the method comprising:
determining a number of build-up layers required for the integrated electronic panel assembly, wherein each build-up layer contributes an amount of concavity to the integrated electronic panel assembly;
predicting a level of global convex warpage on the integrated electronic panel assembly provided by the presence of an embedded ground plane (EGP) alone within the integrated electronic panel assembly and in the absence of any build-up layers, wherein
the embedded ground plane includes openings therein for accepting at least one die within a corresponding opening,
the global convex warpage is contributed by the embedded ground plane globally to the integrated electronic panel assembly,
the global warpage control element contributes the fixed amount of global convex warpage to the integrated electronic panel assembly upon fabrication of the integrated electronic panel assembly, and
the predicted level of global convex warpage is dependent upon one or more of: a gap between an edge of a die of the at least one die and an edge of the embedded ground plane opening containing the die, and a difference in width between a portion of the embedded ground plane and a local warpage control element coupled to that portion of the embedded ground plane;
determining an amount of local convex warpage to be introduced into the integrated electronic panel assembly which together with the fixed amount of global convex warpage provides a combined convex warpage to the integrated electronic panel assembly, further for counteracting the concavity to be introduced subsequently by a build-up layer processing sufficient to enable subsequent planar processing of a completed integrated electronic panel assembly, wherein a local warpage control element contributes the amount of local convex warpage to the integrated electronic panel assembly upon fabrication thereof, wherein the local warpage control element comprises a metal post feature extending in between and along side edges of two adjacent die of the plurality of die, wherein a centerline of the metal post feature is disposed along a centerline of a corresponding portion of the EGP in between the two adjacent die, further wherein the metal post feature has a width dimension less than a width dimension of the EGP, wherein the width dimension for the metal post feature and the width dimension for the EGP are measured in a direction perpendicular to the side edges of two adjacent die of the plurality of die;

fabricating the integrated electronic panel assembly pre-build-up layer processing; and performing build-up layer processing, wherein the build-up layer processing includes forming the number of build-up layers that contribute a cumulative amount of concave warpage to the integrated electronic panel assembly, wherein together with the global and local convex warpage, the integrated electronic panel assembly with build-up layers is substantially planar for enabling subsequent planar processing, wherein the integrated electronic panel assembly comprises a panel assembly having a principal dimension on the order of 200-300 mm in diameter and having a thickness on the order of 0.65 mm, wherein a die-to-die spacing between adjacent die is on the order of 2.0 mm, wherein the EGP includes a width dimension on the order of 1.5 mm and a thickness dimension on the order of 0.125 mm, and wherein the local warpage control element includes a width dimension on the order of 1.0 mm and a thickness dimension on the order of 0.525 mm.

* * * * *